(12) United States Patent
Shih et al.

(10) Patent No.: US 6,949,802 B2
(45) Date of Patent: Sep. 27, 2005

(54) ESD PROTECTION STRUCTURE

(75) Inventors: Jiaw-Ren Shih, Hsin-Chu (TW); Jian-Hsing Lee, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 10/718,363

(22) Filed: Nov. 20, 2003

(65) Prior Publication Data

US 2005/0110095 A1 May 26, 2005

(51) Int. Cl.$^7$ ................................................ H01L 29/78
(52) U.S. Cl. ...................... 257/401; 257/355; 257/356; 257/357; 257/567; 361/111
(58) Field of Search ......................... 257/173, 355–357, 257/360–363, 368, 401, 567; 361/111, 156

(56) References Cited

U.S. PATENT DOCUMENTS

| | | | |
|---|---|---|---|
| 3,806,773 A | * 4/1974 | Watanabe | ................... 257/356 |
| 5,761,697 A | * 6/1998 | Curry et al. | ................. 711/100 |
| 5,814,866 A | * 9/1998 | Borland | ....................... 257/369 |
| 5,877,927 A | 3/1999 | Parat et al. | .................... 361/56 |
| 5,907,464 A | 5/1999 | Maloney et al. | ............. 361/111 |
| 5,959,820 A | 9/1999 | Ker et al. | .................... 361/111 |
| 6,157,530 A | 12/2000 | Pequignot et al. | ........... 361/111 |
| 6,249,414 B1 | * 6/2001 | Lee et al. | .................... 361/111 |
| 6,271,999 B1 | * 8/2001 | Lee et al. | ...................... 361/56 |

* cited by examiner

*Primary Examiner*—Minhloan Tran
*Assistant Examiner*—Thomas L. Dickey
(74) *Attorney, Agent, or Firm*—Thomas, Kayden, Horstemeyer & Risley

(57) ABSTRACT

The invention describes structures and a process for providing ESD protection between multiple power supply lines or buses on an integrated circuit chip. Special diode strings are used for the protection devices whereby the diodes are constructed across the boundary of an N-well and P substrate or P-well. The unique design provides very low leakage characteristics during normal circuit operation, as well as improved trigger voltage control achieved by stacking 2 or more diodes in a series string between the power buses.

24 Claims, 7 Drawing Sheets

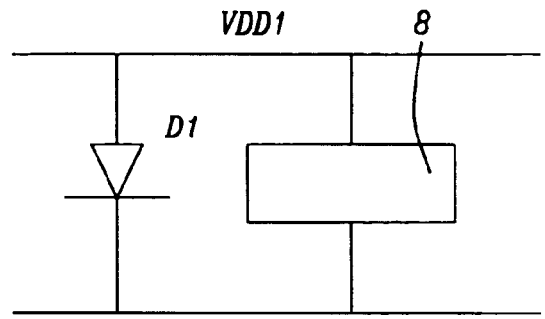
FIG. 1A – Prior Art
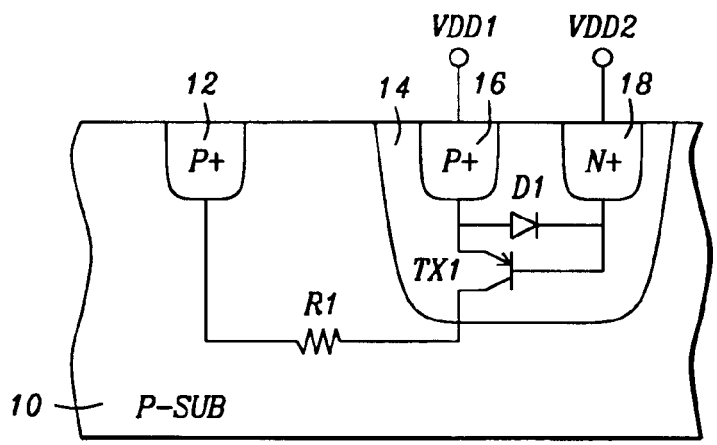
FIG. 1B – Prior Art
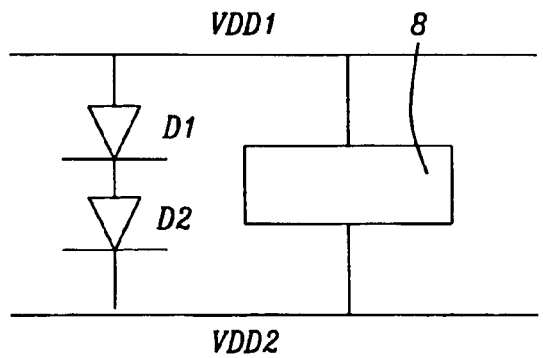
FIG. 2A – Prior Art

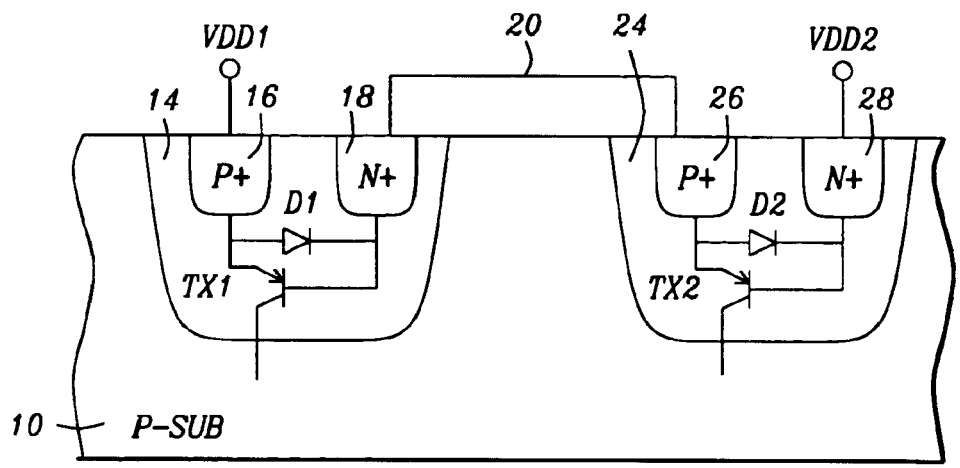
FIG. 2B – Prior Art
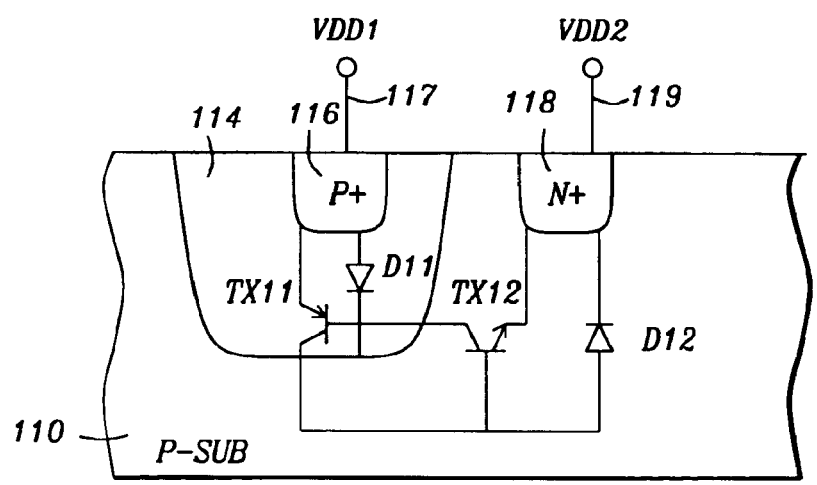
FIG. 3

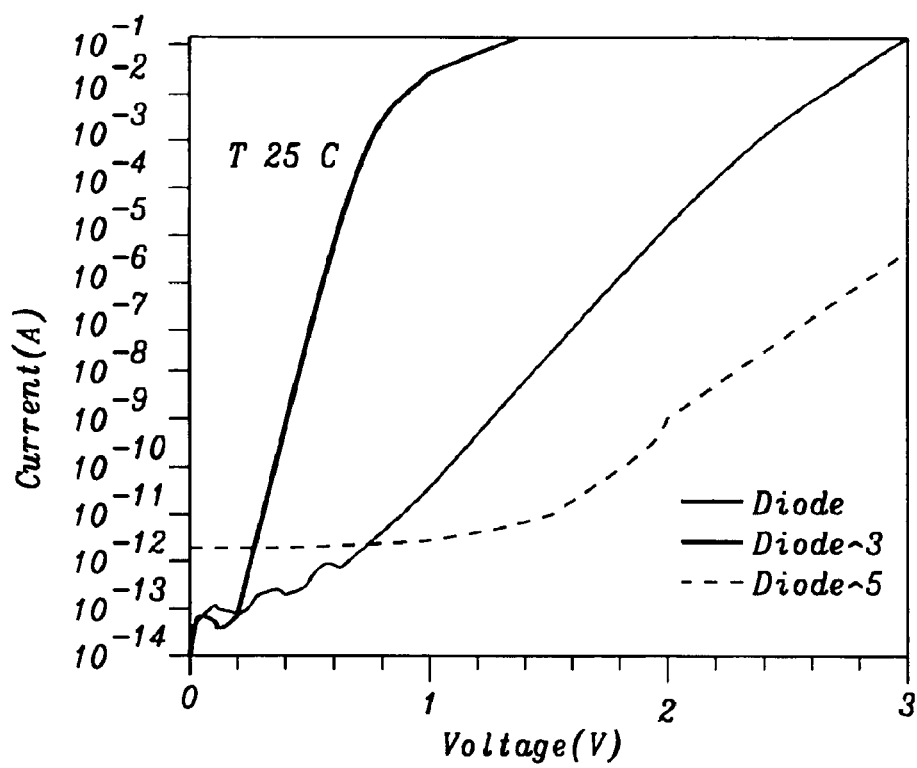
FIG. 6A - Prior Art
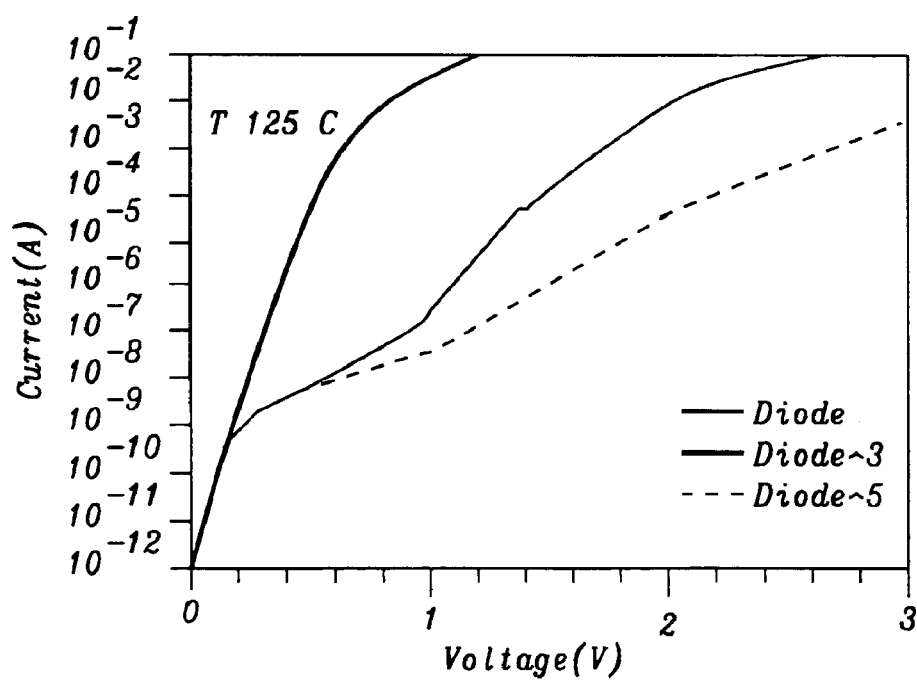
FIG. 6B - Prior Art

ESD PROTECTION STRUCTURE

FIELD OF THE INVENTION

The present invention relates generally to the structure and process for an ESD protection arrangement for ESD protection of single and multiple power supply feeds for integrated circuits and specifically to diode protection devices with associated parasitic bipolar transistors for power to power ESD protection.

DESCRIPTION OF PRIOR ART

Protection of integrated circuits from large, abnormal voltage or current surges such as caused by electrostatic discharge events (ESD) is increasingly important as device geometry is decreased. In particular the high impedance and relatively fragile gate oxide of field effect (FET) devices places further emphasis on the need for ESD protection. In addition multiple power lines often called power or voltage buses or rails require ESD protection with the protection devices affording minimum leakage between the various voltages levels and between the voltage levels and the reference level, typically ground. Some typical multiple power rail applications are mixed voltage interface circuitry and some dynamic random access memory applications.

One type of device typically used for ESD protection is the diode used singularly as shown in Prior Art FIG. 1A or in a "stacked" series string as indicated in Prior Art FIG. 2A. Stacking the diodes in a series string can increase the breakdown threshold or trigger voltage, but not as much as often desired to match application requirements Although diodes can provide effective ESD protection, conventional diodes have a leakage current component during normal operation which can be detrimental to normal circuit operation. The logic circuits being protected are represented by element 8 in Prior Art FIGS. 1A and 2A.

FIG. 1B shows a typical prior art ESD protection diode device structure. An N-well 14 is shown on a P doped substrate 10. The basic diode D1 is contained within the P-well 14. The anode is formed by the P+ region 16, while the cathode is formed by the N-well 14 and the N+ contact region 18. The diode device D1 is therefore in series with the P+ anode contact region 16 and the N+ cathode contact region 18. VDD2 is connected to the N+ contact 18 and is typically a higher positive potential than VDD1, which is connected to the P+ contact 16.

Also shown in FIG. 1B is the parasitic PNP bipolar transistor TX1 whose emitter is formed by the P+ contact region 16, the base is formed by the N-well 14 and the collector is formed by the substrate 10. The collector is connected to the reference voltage Vss, typically ground, through a substrate diffusion resistance represented by R1, and the substrate P+ contact 12.

During a positive ESD event on VDD2, the diode D1 goes into a secondary breakdown mode conducting the ESD energy between VDD2 and VDD1. The bipolar transistor TX1 also will go into breakdown mode conducting the ESD energy to the reference voltage source, or ground. The secondary breakdown current occurs at a "snapback" voltage level much less than the threshold voltage, reducing the power dissipation in this region that is also known as the holding current region.

FIG. 2A illustrates a diode series string protection circuit. The multiple diodes D1, D2 are intended to increase the trigger or threshold voltage of the protection circuit.

The device structure of a prior art series diode string is illustrated in FIG. 2B. In addition to the first N-well 14, with related P+ contact 16 and N+ contact 18 and which contains a first diode D1 with associated parasitic PNP bipolar transistor TX1, a second N-well 124 is present on the P doped substrate 10. The second N-well 24 contains the second diode D2, with associated parasitic bipolar transistor TX2.

Diode D2 is formed in a similar way in the second N-well 24 as diode D1 is formed in the first N-well 14. The anode of diode D2 is formed from the P+ doped contact region 26, while the second N-well 24 forms the cathode. The emitter of TX2 is formed by the P+ contact 26, the base by the second N-well 24 and the N+ contact 28, and the collector by the P substrate 10 and performs a similar function as TX1 in N-well 14.

The first N-well 14 N+ doped contact region 18 is connected by a conductor element 20 to the P+ doped contact region 26 of the second N-well 24. The two diodes in series increase the reverse threshold voltage to provide a measure of "tuning" the protective circuit to the application requirements.

However, as noted, leakage can increase appreciably with this method of creating the ED protection devices.

The invention provides a unique and novel method and structure for providing diode devices with minimum leakage for ESD protection by utilizing a diode device structure outside of the N-well proper.

The following patents and reports pertain to ESD protection.

U.S. Pat. No. 5,907,464 (Maloney et al.) discusses diode strings in ESD devices in the prior art section.

U.S. Pat. No. 5,877,927 (Paret et al) shows an ESD device with diode strings.

U.S. Pat. No. 6,157,530 (Pequignot et al.) shows an ESD device with diode strings.

U.S. Pat. No. 5,959,820 (Ker et al.) shows a LVTSCR and ESD device.

SUMMARY OF THE INVENTION

Accordingly, it is the primary objective of the invention to provide an effective structure and manufacturable method for providing an ESD clamping protection element for power bus protection and connection.

It is a further objective of the invention to provide ESD protection for power-to-power incidents while providing lower protection device leakage and the ability to increase operating voltage with increased diodes in a string without appreciably increasing protection device leakage.

A still additional objective of the invention is to provide the ESD protection with reduced device leakage without changing the characteristics of the internal circuits being protected and by using a process compatible with the process of integrated MOS device manufacturing.

The above objectives are achieved in accordance with the methods of the invention that describes a structure and a manufacturing process for semiconductor ESD protection devices with reduced leakage characteristics.

One embodiment of the invention utilizes a PN diode as an ESD energy clamp from an integrated circuit first voltage source (VDD1) to an integrated circuit second voltage source (VDD2). The second voltage source (VDD2) is typically at a higher potential than the first voltage source (VDD1). A typical example would be where VDD1 would be 1.8 volts and VDD2 would be 3.3 volts.

VDD1 is connected to a P+ doped contact region within a N-well on a P substrate. VDD2 is connected to a N+ doped contact region on the substrate in proximity to, but outside of, the N-well. A unique feature of the invention is in relocating the N+ contact from within the N-well and locating it within the P substrate or within a P well external to the N-well. This separates the P+ and N+ elements by an additional N–P junction, which provides additional isolation and hence reduced leakage.

A second embodiment of the invention is to string two or more ESD power protection devices in series. This is again accomplished by locating the N+ cathode terminal of the device outside of the associated N-well. The second device is replicated by using a second N-well and connecting the first device N+ cathode terminal to the second device P+ terminal by means of a separate electrical conductor. The two devices are now in series, but maintain a reduced leakage characteristic. The number of series devices can be increased to a relatively large practical number because of the low leakage characteristic.

BRIEF DESCRIPTION OF THE DRAWINGS

FIG. 1A shows a schematic representation of a prior art ESD protection scheme with a single diode between VDD1 and VDD2.

FIG. 1B shows the device configuration of the prior art single diode ESD device.

FIG. 2A shows a schematic representation of a prior art two-diode string protection device scheme.

FIG. 2B shows the device configuration for the prior art two diode string protection device scheme.

FIG. 3 shows the device configuration for one embodiment of the invention.

FIGS. 6A and 6B show the test leakage currents for prior art diode protection devices at both 25° C. and 125° C.

DESCRIPTION OF THE PREFERRED EMBODIMENTS

Figure 4A:
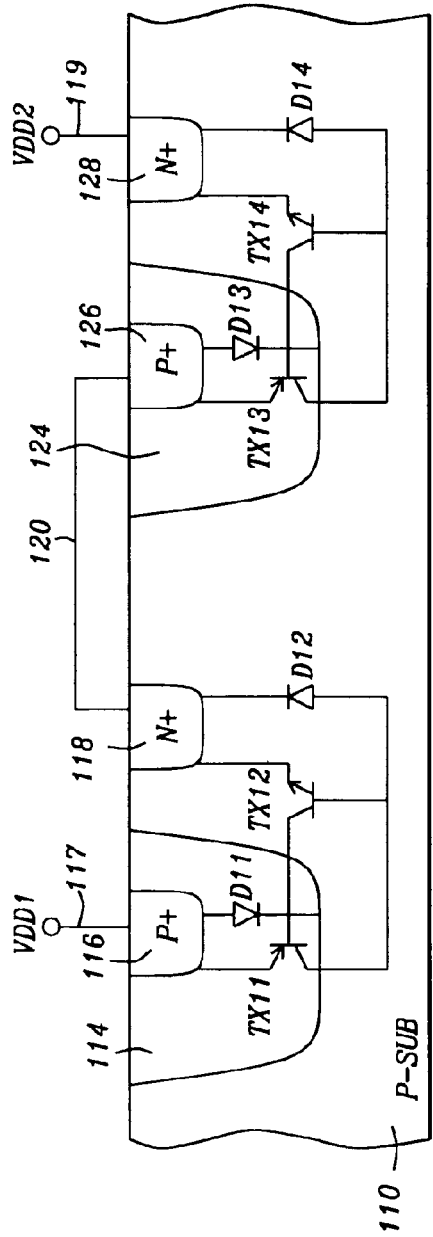
FIGS. 4A and 4B show the device configuration for another embodiment of the invention with more than one device in the series string.

FIG. 3 shows the device structure arrangement of one embodiment of the invention. Starting with a P doped substrate 110, typically created on a single crystal silicon wafer of <100> crystal orientation and with a typical doping level of between 1E15 and 5E15 a/cm$^3$, processing is initiated as is well known in the art to define the active device areas.

After appropriate processing as is well understood in the art, an N-well is defined. This is typically done using a donor dopant such as phosphorous (P) in an ion implant process with an implant energy typically in the range of between 400 and 800 KeV and a dopant concentration of between 6E12 and 2E13 a/cm$^2$. The resulting N-well has a typical dopant density of between 1E16 and 1E18 a/cm$^3$.

Contained within the N-well 114 is a P+ contact 116. Again, this is created by methods well known in the art. One such method is ion implant with an acceptor element such as boron (B) in a dosage of between 1E15 and 5E15 a/cm$^2$ and implant energy of between 4 and 10 KeV. The resultant P+ region 116 has a typical dopant concentration of between 1E20 and 1E21 a/cm$^3$.

As shown in FIG. 3, the P substrate 110 contains a N+ doped contact region 118. Again, this contact region or element is created by conventional methods as is well known in the art such as ion implant. A typical donor dopant such as arsenic (As) at a dosage of between 1E15 and 6E15 a/cm$^2$, an implant energy of between 20 and 80 KeV could typically be used to create the N+ region 118. The resulting N+ region 118 typically has a dopant density of between 1E20 and 1E21 a/cm$^3$.

The P+ region 116 forms the anode of protection device diode D11. It also forms the emitter of the parasitic PNP bipolar transistor TX11. The N-well 114 forms the cathode of the protection diode D11 as well as the base region of the parasitic PNP transistor TX11 and the collector of a parasitic NPN bipolar transistor TX13. The diode D11 is essentially electrically in parallel with the transistor TX11 emitter-base junction.

The P substrate 110 forms the collector of parasitic PNP transistor TX11 and also forms the base of the NPN bipolar transistor, TX12. TX12 is a NPN parasitic transistor whose collector is formed by the N-well 114, the base as previously noted by the substrate 110, and the emitter by the substrate N+ contact region 118. The substrate 110 also forms the anode of protection diode D12. The cathode of D12 is formed by the substrate N+ contact region 118.

The essence of this embodiment of the invention is the moving of the N+ region from inside the N-well 114 as in prior art to a region outside of, but adjacent to, the N-well 114. This provides a base collector junction in addition to the protection diode junctions, which reduces the leakage characteristic of a single diode junction as in prior art.

In the invention arrangement, the N-well 114 P+ doped contact 116 and the substrate 110 N+ contact 118 in proximity to N-well 114 essentially form a doped region pair. The doped region pair, or doped pair, together with the N-well 114 and substrate 110, contains all the required elements of the invention protection device.

Diode D11 anode is connected to a first logic voltage supply VDD1, by an external conductor 117. External conductor 119 connects the cathode of diode D12 to a second supply voltage, VDD2. VDD2 is normally a higher voltage potential than VDD1 in normal circuit operation. In the event of a positive ESD event on power line VDD2, diodes D12 and D11 will go into reverse breakdown and conduct the energy into the first power line VDD1. This low voltage conduction path shunts the ESD energy away from the normal active logic circuits or other elements that may be attached to the power bus.

Another embodiment of the invention is shown in FIG. 4A for the case when it is desirable to connect more than one diode in a series string between the power buses. Again, the devices are on a P doped substrate 110. The substrate 110 doping is similar to before, that is, the P dopant concentration is in the range between 1E15 and 5E15 a/cm$^3$. There is a first N-well 114 created from a known process such as ion implant from a donor dopant such as P to produce a N-well with a dopant concentration of between 1E16 and 1E18 a/cm$^3$.

As shown in FIG. 4A, a P+ doped region 116 exists within the first N-well 114. Again, the dopant concentration of P+ region 116 is typically in the range of between 1E20 and 1E21 a/cm$^3$. The P+ doped region is connected to a first voltage, VDD1, by an external conductor element 117.

Within the substrate 110 is a second N-well 124 with similar dopant characteristics to the first N-well 114. The second N-well 124 also has a P+ doped region 128, with similar dopant characteristics to the P+ doped region 116 within the first N-well 114. That is a dopant concentration in the range between 1E20 and 1E21 a/cm$^3$.

Again referring to FIG. 4, it can be seen that external to the two N-well areas are a first N+ region 118 in proximity to N-well 114 and a second N+ region 128 in proximity to N-well 124. Each substrate N+ contact region (118, 128) essentially forms a doped pair with the associated N-well P+ contacts (116, 126). That is, N+ contact region 118 is essentially paired with P+ contact 116, and N+ contact 128 is essentially paired with P+ contact 126.

The two N+ regions have been created in a similar well-known manner. For example by means of ion implantation with a donor dopant such as As at a dosage of between 1E15 and 5E15 a/cm$^2$ and a energy between 20 and 80 KeV. The resultant N+ regions will have a dopant concentration of between 1E20 and 1E21 a/cm$^3$.

The first substrate N+ region 118 is connected to the second N-well P+ region 126 by an external conductor element 120. The second substrate N+ element 128 is connected to a second voltage source, VDD2, by means of an external conductor element 119.

The first N-well 114 P+ region 116 forms the anode of protection diode D11 and the emitter of the parasitic PNP bipolar transistor TX11. The first N-well 114 forms the diode D11 cathode and the base of PNP bipolar transistor TX11. The first N-well 114 also forms the collector of parasitic bipolar NPN transistor TX12. The P substrate forms the anode of diode 12 and the base of transistor TX12.

The second N-well 124 P+ region 126 forms the cathode of diode D13 and the emitter of bipolar transistor TX13. The second N-well 124 forms the base of TX113, the cathode of diode D13, and the collector of transistor TX14. The substrate 110 forms the collector of transistor TX13, the base of parasitic NPN bipolar transistor TX14, and the anode of diode D14. Completing the circuit, the N+ substrate contact 128 forms the emitter of the NPN bipolar transistor TX14 and the cathode of diode D14. The cathode of D12 is connected to the anode of D13 by an external conductor element 120 that is connected to N+ region 118 and the P+ region 126.

Figure 4B:
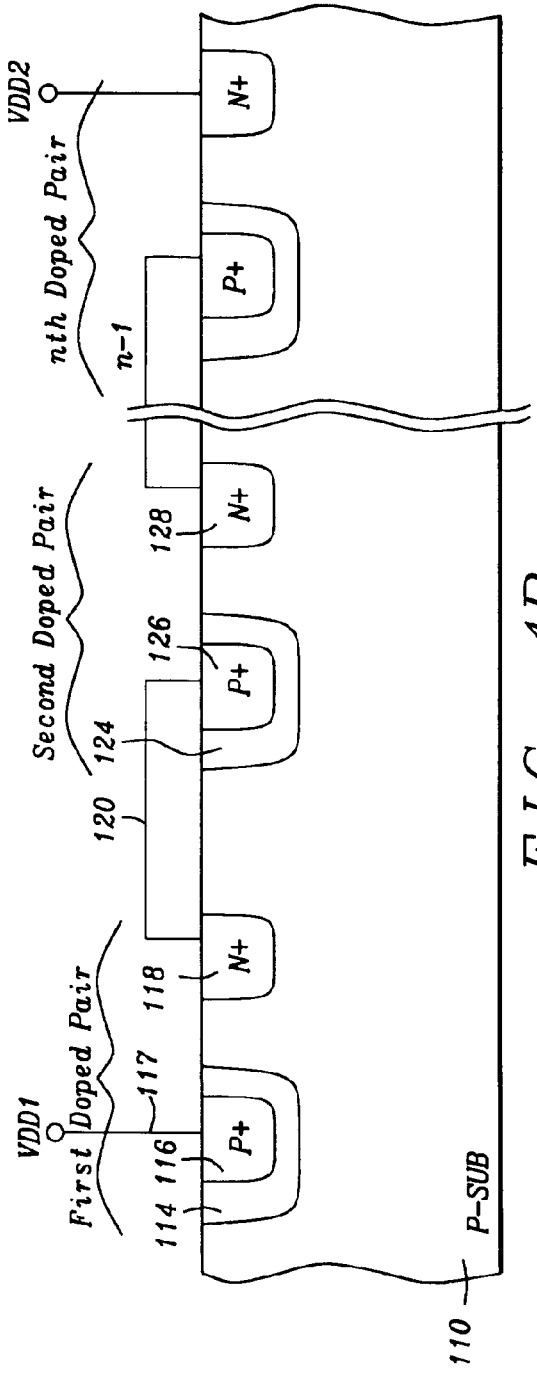

The circuit arrangement enabled by this invention embodiment allows two or more diodes to be placed in series between the two power supply lines. FIG. 4B illustrates a case where n devices in series are inserted between VDD1 and VDD2. The number of devices can vary from 2 to 10 to match application conditions.

The n-th protection devices are contained in and derived from the n-th doped pair and are essentially the same type devices as derived from the first and second doped pair.

Figure 5A:
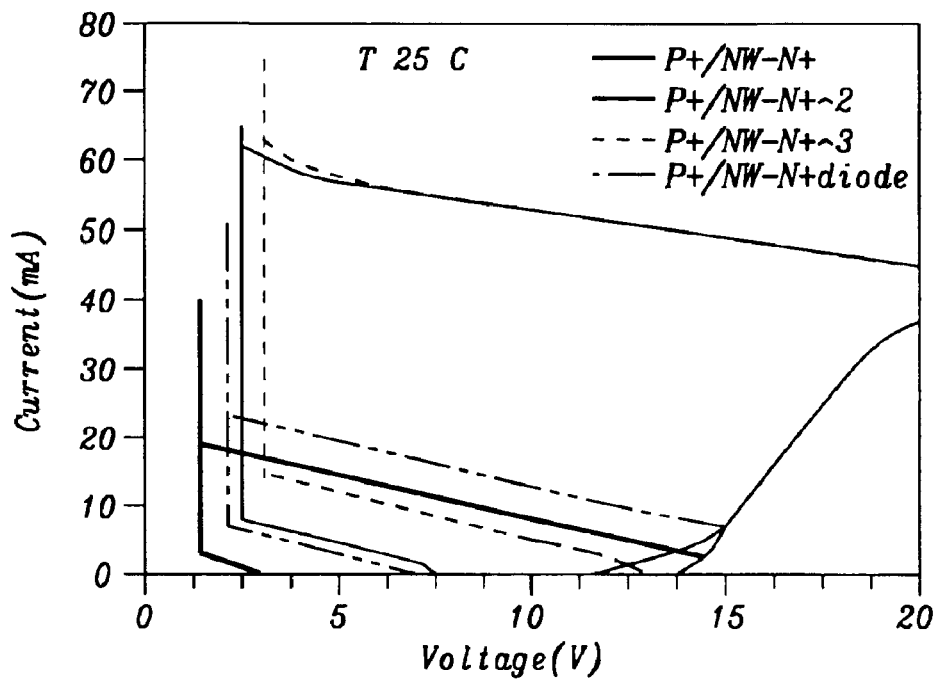
FIGS. 5A and 5B show the I–V holding characteristics of the invention devices for 1, 2 and 3 diodes plus one new with one prior art diode showing the controlled differences for turn-on threshold voltages for the different configurations.

FIG. 5A shows the results of the "Hold" I–V characteristics of the invention device designated as P+/NW–N+. The test conditions are 25 degrees centigrade (° C.) and with the P substrate tied to ground. The onset or threshold of breakdown is clearly seen for each configuration followed by the "snapback" region where the voltage rapidly decreases from the initial voltage. A relatively constant voltage is reached where current rapidly increases. This voltage is known as the "holding" voltage and should be reasonably low in order to minimize the power dissipation during the ESD event.

The invention diode devices are designated as P+/NW–N+. A series string of 2 invention diodes is designated by the suffix ^2 and a three invention diode string is designated by ^3. A special case of one invention diode device and one prior art device in a series string designated as P+/NW–N+ diode is included for comparison purposes. The data for this arrangement is very similar to the curve trace for P+/NW–N+ ^2 demonstrating no degradation in holding voltage characteristics for the invention devices.

Figure 5B:
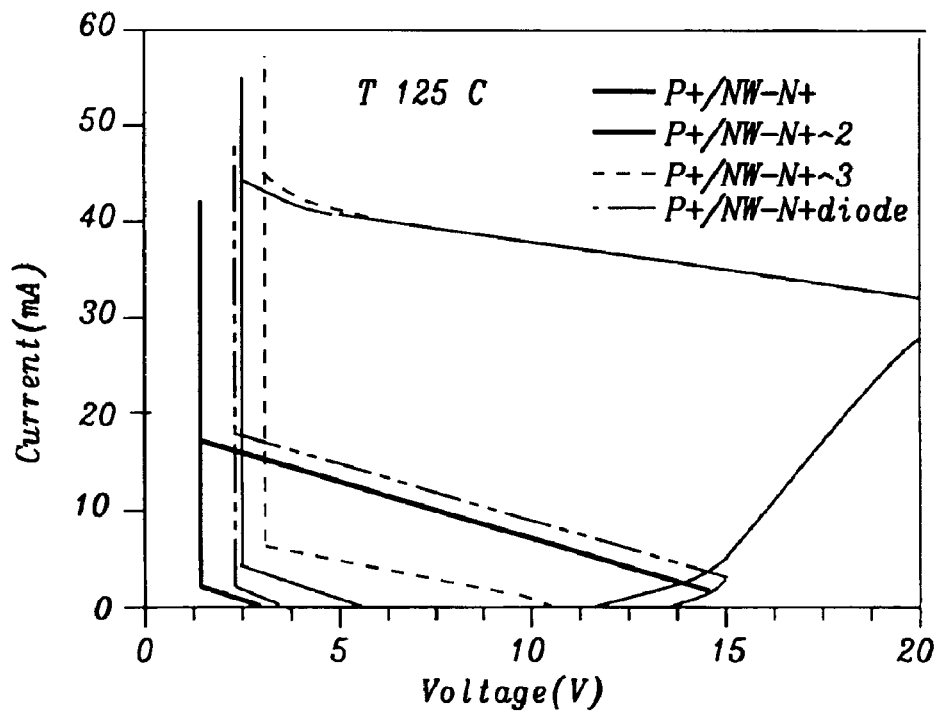

FIG. 5B shows the same test conditions repeated at 125° C. Again, the consistency of the holding voltage relative to the prior art device can be seen.

It can be seen in FIG. 5A that an increase in the number of diodes in the string from one to 3 increases the threshold, or ESD turn-on voltage, from approximately 3.0 volts for one diode to 7.0 volts for 2 diodes and almost 13 volts for 3 invention diode devices. This demonstrates the degree of control in threshold voltage obtained by using a different number of diodes in the string from one power bus to another.

Table 1 below is a summary of the "Holding Voltages", exhibited by the invention devices and one invention device and one prior art device designate 1+1 in the table. The holding voltage is a key characteristic of ESD protection devices as the lower the holding voltage, the less the power dissipation for a given current level.

The table illustrates the maximum change in holding voltage for different numbers of invention diode devices in the diode string at 25° C. and 125° C. and the P substrate grounded. Included in the table is an addition test case at 25° C. whereby the substrate is left floating.

The 25° C. and 125° C. rows are measurements taken at the respective temperatures with the substrate Vss connection grounded The Vss Floating row represents measurements taken with the substrate Vss connection floating.

As indicated in the table, the maximum holding voltage is 3.34 volts for 3 diodes in a string.

TABLE 1

Holding Voltage vs. Number of Invention Device Diodes
Holding Voltage vs. Number of Invention Diodes

| No. of Diodes | 1 | 2 | 3 | 1 + 1* |
|---|---|---|---|---|
| 25° C. - Vss Gnd | 1.0 V | 2.16 V | 3.34 V | 1.98 V |
| 125° C. - Vss Gnd | 0.9 V | 1.86 V | 2.78 V | 1.6 V |
| 25° C. - Vss Floating | 0.92 V | 2.0 V | 2.3 V | 1.0 V |

*1 + 1 diodes is 1 invention diode, 1 prior art diode

FIGS. 6A and 6B show the DC I–V characteristics of the prior art diode strings at 25° C. and 125° C. It is seen that the leakage current starts rising rapidly with increasing voltage. For example, if a "turn-on" current is assumed to be 1 microamp (uamp), this value is reached at a nominal voltage of 0.6 volts for a single prior art diode at 25° C. At 125° C. the leakage current curve is much steeper, with 1 uamp of current being reached at a nominal 0.4 volts.

Figure 7A:
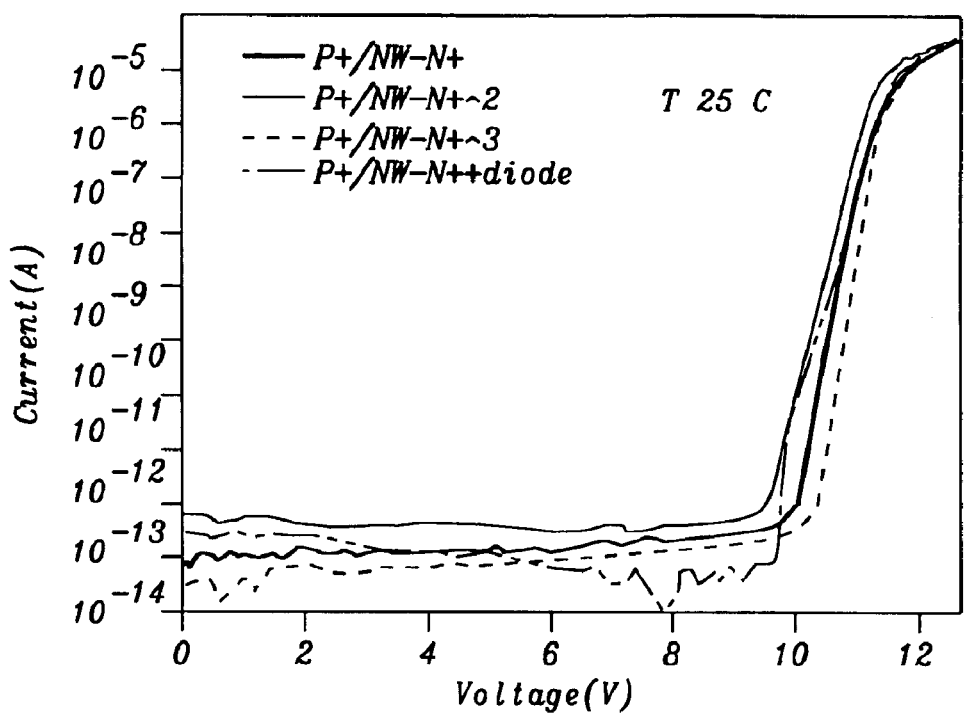
FIGS. 7A and 7B show the test leakage currents for the invention devices at 25° C. and 125° C. showing the improved leakage characteristics of the invention.
Figure 7B:
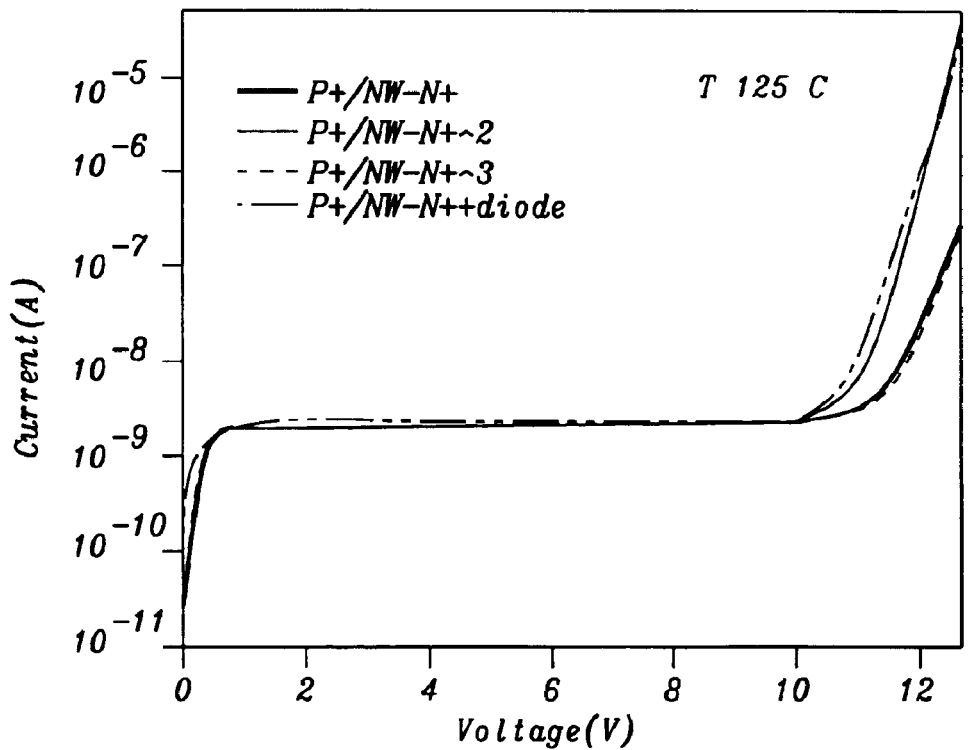

FIGS. 7A and 7B show the leakage characteristics of the invention devices at 25° C. and at 125° C. showing significant improvement in the leakage current over prior art devices. Indeed, a 1 uamp current is not reached until a nominal voltage of 10 volts for both 25° C. and 125° C. This outstanding improvement in leakage current characteristics shows one significant advantage of the invention devices.

Figure 8A:
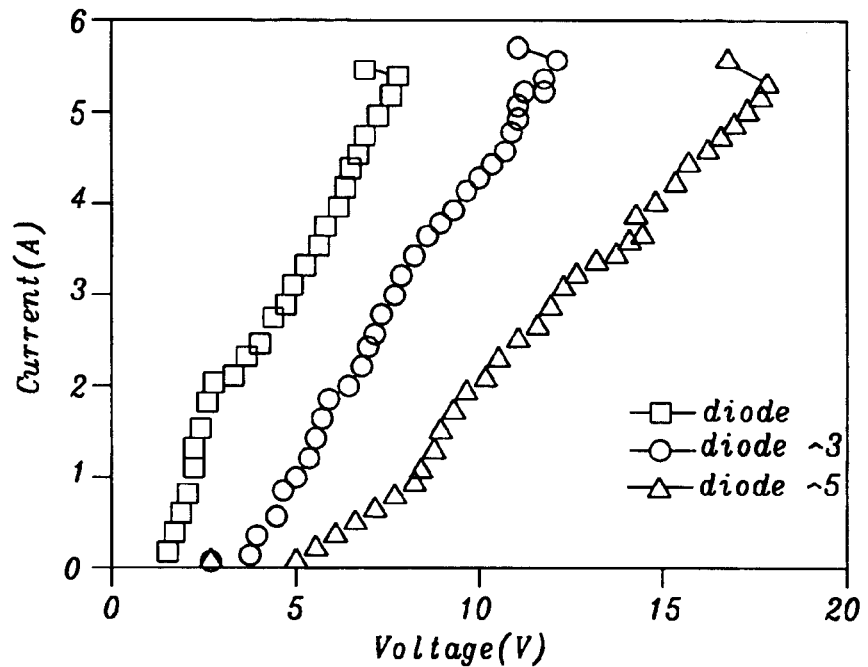
FIG. 8A shows the ESD protection current for prior art devices.
Figure 8B:
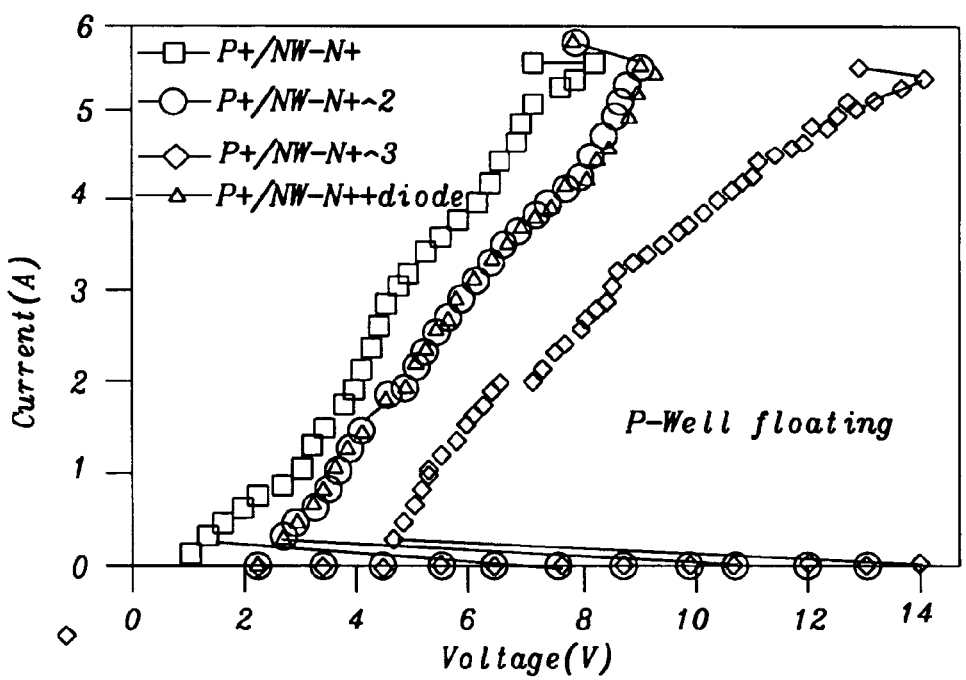
FIG. 8B shows the ESD protection current for the invention devices.

FIGS. 8A and 8B show the ESD protection breakdown I–V characteristics of prior art devices and the invention devices respectively. The one prior art diode device is designated "diode" in the legend, a three prior art diode string is designated "diode ^3", and five prior art diodes are designated "diode ^5" in the chart legend. The invention device characteristics are shown in FIG. 8B. A single invention diode is designated "P+/NW–N+" in the chart legend. Two invention devices are designated "P+/NW–N+ ^2" and three invention devices are designated "P+/NW–N+^3". An invention diode device in series with a prior art device is designated "P+/NW–N++ diode".

The prior art diode together with the invention device exhibits similar protection characteristics as two of the invention devices. Also, comparing FIGS. 8A and 8B shows that ESD protection current characteristics are similar for both prior art and invention devices. Therefore, there is no degradation in ESD protection for invention devices that exhibit superior leakage characteristics as shown in FIGS. 6A through 7B.

Table 2 below summarizes the maximum ESD current capability before failure for various diode string configurations as shown in FIGS. 8A and 8B. The maximum current is essentially the same for all configurations, which is between 5.3 amps and 5.6 amps.

TABLE 2

Maximum ESD Current vs. Number of Invention Devices in String
Maximum Current vs. Number of Devices

| No. of Devices | 1 | 2 | 3 | 5 | 1 + 1* |
|---|---|---|---|---|---|
| Invention Devices Vss Floating | 5.5 A | 5.5 A | 5.5 A | — | 5.5 A |
| Invention Devices Vss Ground | 5.4 A | 5.4 A | 5.4 A | — | 5.4 A |
| Prior Art Devices | 5.3 A | — | 5.6 A | 5.4 A | |

*1 + 1 diodes is 1 invention diode, 1 prior art diode

While the invention has been particularly shown and described with reference to the preferred embodiments thereof, it will be understood by those skilled in the art that various changes in form and details may be made without departing from the spirit and scope of the invention.

What is claimed is:

1. A power-to-power semiconductor ESD protection structure on a semiconductor substrate comprising:
   at least one first doped region within said substrate having opposite dopant than said substrate;
   a second doped region within each said first doped region having opposite dopant type than each said first doped region;
   at least one third doped regions within said substrate having opposite dopant type from said substrate, each said third doped region forming a doped pair with each said second doped region;
   conductor elements connecting said third doped region of one said doped pair to said second doped region of a subsequent said doped pair;
   a conductor element from said second doped region of a first said doped pair to a first voltage source; and
   a conductor element from said third doped region of a last said doped pair to a second voltage source;
   wherein each said first doped region is substantially free of doped regions having the same dopant type as said first doped region.

2. The protection structure of claim 1 wherein said substrate is P doped with a concentration between 1E15 and 5E15 a/cm$^3$.

3. The protection structure of claim 1 wherein each said first doped region is doped with a donor dopant to form N-well regions with a typical dopant density of between 1E16 and 1E18 a/cm$^3$.

4. The protection structure of claim 1 wherein each said second doped regions within each said first doped region is doped with an acceptor dopant to form P+ regions with a dopant concentration between 1E20 and 1E21 a/cm$^3$.

5. The protection structure of claim 1 wherein each said third doped region within said substrate is doped with a donor dopant to form multiple N+ regions with a dopant concentration of between 1E20 and 1E21 a/cm$^3$.

6. The protection structure of claim 1 wherein said second doped region of said first doped pair is the anode of a first diode protection element and the emitter of a first parasitic bipolar PNP transistor.

7. The protection structure of claim 6 wherein said first doped region is the cathode of said first diode protection element and also the base of said first parasitic bipolar PNP transistor and the collector of a first parasitic NPN bipolar transistor.

8. The protection structure of claim 7 wherein said substrate is the collector of said first parasitic bipolar PNP transistor, the base of said first parasitic NPN bipolar transistor, and the anode of a second diode protection element.

9. The protection structure of claim 8 wherein said third doped region of said first doped pair is the cathode of said second diode protection element and the emitter of said first parasitic NPN bipolar transistor.

10. The protection structure of claim 1 wherein said second doped region of said second doped pair is the anode of a third diode protection element and the emitter of a second parasitic PNP bipolar transistor.

11. The protection structure of claim 10 wherein said first doped region which contains said second doped region of said second doped pair is the cathode of said third diode protection element and the base of said second parasitic PNP bipolar transistor.

12. The protection structure of claim 11 wherein said substrate is the collector of said second PNP parasitic bipolar transistor, the base of a second parasitic bipolar NPN transistor, and the anode of a fourth diode protection element.

13. The protection structure of claim 12 wherein said third doped N+ region of said second doped pair is the cathode of said fourth diode protection element, and the emitter of said second NPN parasitic transistor.

14. The protection structure of claim 1, comprising n doped pairs, whereby n can assume the value from two to ten.

15. The protection structure of claim 14 wherein the first conductor element of said conductor elements connects said third doped region of said first doped pair to said second doped region of said second doped pair and the (n–1)-th conductor connects said third doped region of the (n–1)-th doped pair with said second doped region of the n-th doped pair.

16. A power-to-power semiconductor ESD protection structure on a semiconductor substrate comprising:
   a first doped region within said substrate having opposite dopant than said substrate;
   only one second doped region within said first doped region having opposite dopant type to said first doped region;
   a third doped region within said substrate having opposite dopant type from said substrate which when taken with said second doped region within said first doped region forms a doped pair;

a conductor element from said second doped region to a first voltage source; and a conductor element from said third doped region to a second voltage source; wherein the first doped region is substantially free of doped regions having the same dopant type as said first doped region.

17. The protection structure of claim 16 wherein said substrate is P doped with a concentration between 1E15 and 5E15 a/cm$^3$.

18. The protection structure of claim 16 wherein said first doped region is doped with a donor dopant to form a N-well region with a typical dopant density of between 1E16 and 1E18 a/cm$^3$.

19. The protection structure of claim 16 wherein said second doped region is doped with an acceptor dopant to form a P+ region within said N-well region to a concentration between 1E20 and 1E21 a/cm$^3$.

20. The protection structure of claim 16 wherein said third doped region within said substrate is doped with a donor dopant to form a N+ region with a concentration of 1E20 and 1E21 a/cm$^3$.

21. The protection structure of claim 16 wherein said second doped P+ region is the anode of a first diode protection element and the emitter of a parasitic bipolar PNP transistor.

22. The protection structure of claim 21 wherein said first doped region is the cathode of said first diode protection element and also the base of said parasitic bipolar PNP transistor and the collector of a parasitic NPN bipolar transistor.

23. The protection structure of claim 22 wherein said substrate is the collector of said PNP parasitic bipolar transistor, the base of said parasitic bipolar NPN transistor, and the anode of a second diode protection element.

24. The protection structure of claim 23 wherein said third doped region is the cathode of said second diode protection element and the emitter of said parasitic NPN bipolar transistor.

* * * * *